United States Patent [19]

Bok

[11] Patent Number: 5,270,079
[45] Date of Patent: Dec. 14, 1993

[54] METHODS OF MENISCUS COATING

[75] Inventor: Hendrik F. Bok, Fairhaven, Mass.

[73] Assignee: Specialty Coatings Systems, Inc., Indianapolis, Ind.

[21] Appl. No.: 993,315

[22] Filed: Dec. 18, 1992

[51] Int. Cl.⁵ .............................................. B05D 1/28
[52] U.S. Cl. .................................. 427/429; 427/434.2; 427/434.3
[58] Field of Search ............... 427/434.2, 434.3, 428, 427/429, 345; 118/401, 268, 419

[56] References Cited

U.S. PATENT DOCUMENTS

| | | | |
|---|---|---|---|
| 1,289,507 | 12/1918 | Mason | 118/244 |
| 3,294,576 | 12/1966 | Geraghty | 117/98 |
| 3,367,791 | 2/1968 | Lein | 117/37 |
| 3,429,741 | 2/1969 | Moriarty | 117/111 |
| 3,473,955 | 10/1969 | Moriarty | 117/111 |
| 3,535,157 | 10/1970 | Steinhoff et al. | 117/212 |
| 3,589,975 | 6/1971 | Andrews et al. | 161/165 |
| 3,756,196 | 9/1973 | Furuuchi et al. | 118/401 |
| 4,004,045 | 1/1977 | Stelter | 427/55 |
| 4,114,563 | 9/1978 | Schnedler et al. | 118/63 |
| 4,154,193 | 5/1979 | Moriguchi et al. | 118/230 |
| 4,370,356 | 1/1983 | Bok et al. | 427/294 |
| 4,676,404 | 6/1987 | Yamazaki et al. | 222/56 |
| 5,145,546 | 9/1992 | Yuasa et al. | 156/324 |

FOREIGN PATENT DOCUMENTS 1071906  12/1959  Fed. Rep. of Germany.

*Primary Examiner*—Shrive Beck
*Assistant Examiner*—David M. Maiorana
*Attorney, Agent, or Firm*—W. K. Volles

[57] ABSTRACT

Methods are disclosed for coating flat or curved planar surfaces by flowing a coating material through a porous applicator onto the surface of the object to be coated. Menisci of the coating material are maintained between the porous applicator and the surface of the object to be coated by attractive forces between the coating material and the surface of the object. Thin, uniform coating thicknesses, e.g., less than about 1 micron, and conformal coatings of objects having irregular surfaces can be obtained. The methods are useful, for example, for coating objects such as flat panel displays, optical devices, silicon and germanium wafers, and hybrid circuit boards.

17 Claims, 4 Drawing Sheets

METHODS OF MENISCUS COATING

FIELD OF THE INVENTION

The present invention relates to methods for coating objects. More specifically, the present invention relates to methods for applying thin coatings on flat or curved planar surfaces by establishing menisci of a coating material between a porous applicator and the surface of the object to be coated and flowing the coating material through the porous applicator onto the surface of the object.

BACKGROUND OF THE INVENTION

The application of thin coatings of coating materials, i.e., less than about 10 microns, has become an increasingly important step in the manufacture of various products including, but not limited to; flat panel displays such as used in lap top computers, high definition television and computer cathode ray tubes; optical devices such as lenses, color filters and mirrors; hybrid circuit boards and silicon wafers and germanium wafers.

Typical methods for applying coatings to objects such as described above include, for example, dip coating and spin coating. Spin coating is often highly inefficient because typically only a small fraction of the coating material, e.g., less than about 30 percent, is actually deposited on the object to be coated. Often the remainder is wasted. Typically, dip coating methods provide an efficient use of the coating material. However, the coating thickness and coating reproducibility can be difficult to control.

One particularly useful method for applying thin coatings to objects is described in U.S. Pat. No. 4,370,376, issued Jan. 25th, 1983. At Column 1, lines 40 to 57, the patentees disclose that:

"According to the present invention, meniscus coating of an object such as a substrate is accomplished by flowing a coating material through a permeable and sloping surface, so as to develop a downward laminar flow of coating material on the outside of the sloping surface. The object, having a surface to be coated, is advanced tangentially to the downward laminar flow of coating material, such that the surface to be coated intersects the laminar flow of coating material at the apex of the sloping, permeable surface. Menisci of flowing coating material are supported both at the leading edge and the trailing edge of coating material in contact with the surface to be coated. The uniform disengagement and drainage of deposited excess coating material from the coated surface are ensured by uniform menisci and the constant downward laminar flow of coating material on the outside of the sloping surface."

In addition to the methods described in above cited U.S. Pat. No. 4,370,356, improved methods are desired for applying extremely thin coatings, e.g., less than 1 micron, to flat and curved planar surfaces wherein there is little variation in the coating thickness throughout the coated surface. In addition, improved methods are desired to provide thin conformal coatings to objects having irregular surfaces, such as, for example, silicon wafers which have a stepped topography.

SUMMARY OF THE INVENTION

In accordance with the present invention improved methods for coating a surface of an object are provided utilizing an upward flow, or wicking action, of a coating material through a porous applicator onto the surface of the object. The coating is applied by establishing menisci of the coating material between the surface of the object to be coated and the porous applicator, flowing the coating material through the porous applicator onto the surface of the object and advancing the surface of the object relative to the porous applicator to provide the coating.

The basic steps in the coating method upon which the present invention is based include:
a) flowing the coating material in a generally upward direction through a wall of a stationary, permeable applicator to provide the coating material on an outside surface of the applicator;
b) contacting the coating material on the outside surface of the applicator with the surface of the object to be coated to establish menisci of the coating material between the surface of the object and the applicator;
c) advancing the surface of the object in a generally horizontal direction across the applicator; and
d) maintaining the flow of the coating material through the wall of the applicator to provide a coating of the coating material on the surface.

In one aspect of the present invention, the improvement comprises maintaining the flow of the coating material through the wall of the applicator by attractive forces between the surface of the object to be coated and the coating material. Preferably, capillarity assists in transporting the coating material through the applicator.

In another aspect of the present invention, the basic coating method additionally includes the step of establishing a downward laminar flow of the coating material on the outer surface of the applicator. In this aspect of the invention, the improvement comprises discontinuing the downward laminar flow of the coating material on the outer surface of the applicator prior to advancing the surface of the object across the outer surface of the applicator in order to permit the coating material to wick up through the applicator onto the surface.

By virtue of the present invention, extremely thin coatings, e.g., less than about 1 micron, can be applied in a uniform manner. Moreover, the coatings are often conformal and can be applied to objects having irregular, i.e., non-smooth, surfaces.

DETAILED DESCRIPTION OF THE INVENTION

The particular objects being coated are not critical to the present invention. However, it is advantageous if the surface of the object provides attractive forces for the coating material, i.e., the surface is wettable by the coating material. Preferably, the objects have a curved or flat planar surface. The materials of construction of the objects can be, for example, glass, ceramics, metals, plastics and combinations thereof. Typical objects suitable for coating include, but are not limited to; flat panel displays such as used in lap top computers, high definition television and computer cathode ray tubes; optical devices such as lenses, color filters and mirrors; hybrid circuit boards and silicon and germanium wafers, also referred to in the art as semiconductors.

Similarly, the particular coating material used to coat the objects is not critical to the present invention. Typical coating materials include, but are not limited to, photoresists, lacquers, dopants, polyimides, anti-reflection coatings, and the like. The coating material will generally be present in a liquid form dissolved in a solvent. The concentration of the coating material in the solution of solvent and coating material, often expressed as "solids content", will typically be from about 0.5 to 50 weight percent and preferably from about 0.5 to 15 weight percent, based on the total weight of the solution. Preferably the solution containing the coating material is capable of wetting i.e., forming a film on the surface of the object to be coated. Typical solvents used with the coating materials include, for example, N-methylpyrrolidone, xylene, and methyl ethyl ketone. Those skilled in the art can determine the appropriate coating materials, solids content and solvents in amounts suitable for the specific objects to be coated.

The invention is further described with reference to the drawings which are presented for illustrative purposes and are not intended to limit the scope of the claims which follow. Those skilled in the art will recognize that the drawings are presented in a simplified form and do not illustrate various details which are known to those skilled in the art such as, for example, valves, switches, process control devices, wiring, heating elements, machine frames, and the like.

Figure 1:
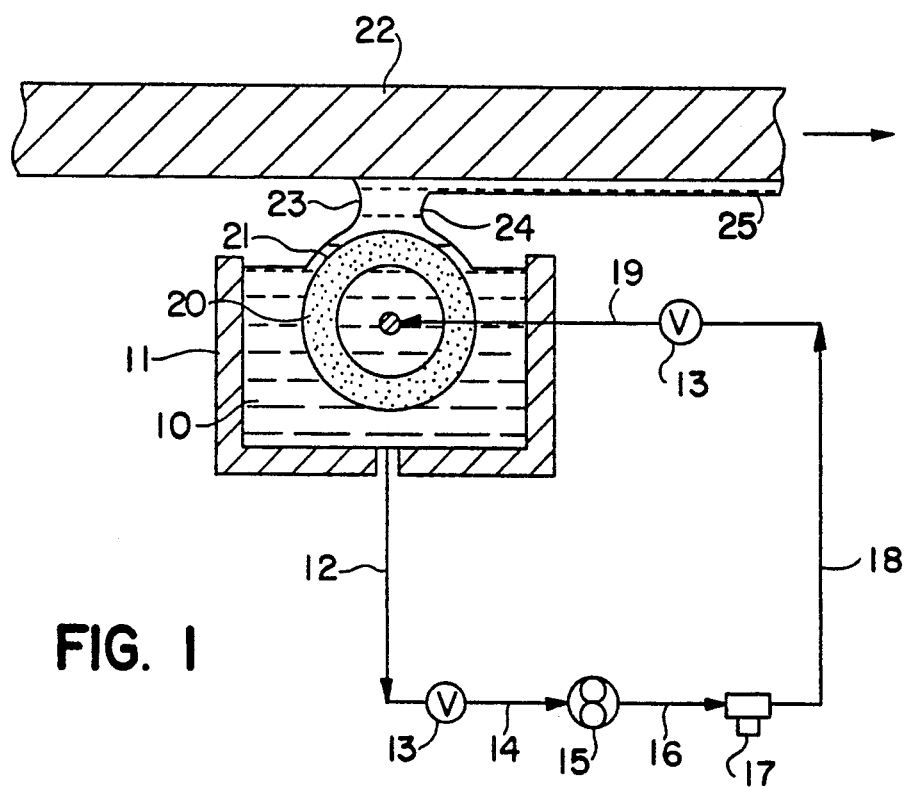
FIG. 1 illustrates the operation of a coating method such as described in above-referenced U.S. Pat. No. 4,370,356 where a coating material is pumped through a porous applicator to provide a downward laminar flow of the coating material over the surface of the applicator during the coating step.

FIG. 1 illustrates the operation of a coating method such as described in above-referenced U.S. Pat. No. 4,370,356, where a coating material is pumped through a porous applicator to provide a downward laminar flow of the coating material over the outer surface of the applicator during the coating step. A coating material 10 is withdrawn from a container 11 via line 12, passed through a solenoid valve 13 and passed via line 14 to a pump 15 wherein it is pressurized to about 2 to 15 psig, depending upon the pore size of the filter and viscosity of the fluid. The pressurized coating material flows from pump 15 via line 16 and is passed through a filter 17 having a pore size of about 0.1 to 10 microns to remove particular materials larger than the pore size of filter 17. A filtered, pressurized coating material is withdrawn from filter 17 via line 18, passed through a second solenoid valve 13 and passed via line 19 to the inside of a porous applicator 20. Porous applicator 20 is comprised of sintered metal, has a circular cross section, is hollow and has a porous wall through which coating material 10 can flow.

The pumping of the coating material through the porous wall of applicator 20 causes a downward laminar flow of the coating material 21 on the outer surface of applicator 20. With pump 15 operating and solenoid valves 13 open, the porous applicator is brought close enough to the surface of object 22 in order to establish a leading meniscus 23 and a trailing meniscus 24. As used herein, the term "leading meniscus" means the meniscus of coating material which is exposed to an uncoated surface of the object, the term "trailing meniscus" means the meniscus of liquid exposed to a coated surface of the object and the term "menisci" means both the leading meniscus and the trailing meniscus.

Once menisci 23 and 24 have been established, object 22 is advanced in a generally horizontal direction across and above the surface of applicator 20 in the direction of the arrow in order to establish a film of coating material 25 on the surface of the object. The downward laminar flow of coating material 21 is continued throughout the coating step.

Figure 2:
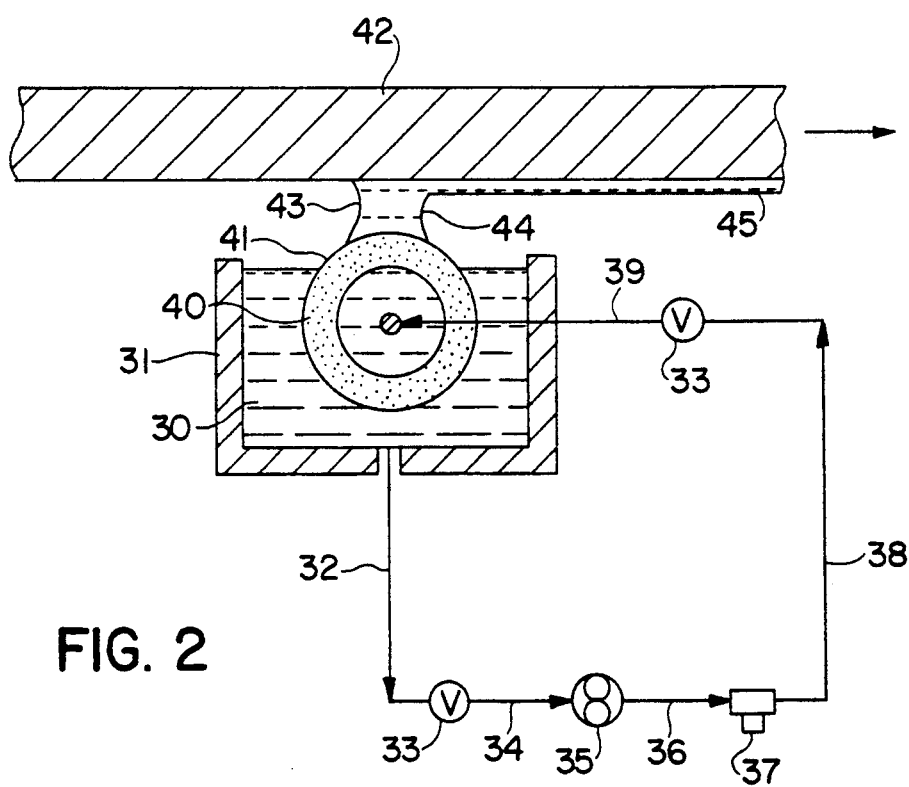
FIG. 2 is schematic view of a coating method in accordance with the present wherein a coating material flows through a porous applicator by attractive forces between the surface of the object to be coated and the coating material during the coating step.

FIG. 2 illustrates the operation of a coating method in accordance with the present invention wherein a coating material flows through a porous applicator by attractive forces between the surface of the object to be coated and the coating material, i.e., a wicking action. In a similar fashion to the method described with reference with FIG. 1, a coating material 30 is withdrawn from a container 31 via line 32, passed through a solenoid valve 33 and introduced via line 34 to a pump 35 wherein it is pressurized to about 2 to 15 psig. A pressurized coating material flows from pump 35 via line 36 and is passed through a filter 37 having a pore size of about 0.1 to 10 microns to remove particulate materials larger than the pore size of filter 37. A filtered, pressurized coating material is withdrawn from filter 37 via line 38, passed through a second solenoid valve 33 and introduced via line 39 to the inside of a porous applicator 40. Porous applicator 40 is comprised of sintered metal, has a circular cross section, is hollow and has a porous wall through which coating material 30 can flow.

In general, applicators suitable for use in accordance with the present invention are porous and have a wall through which the coating material can flow. The outside surface of the porous applicator can be flat or curved. Moreover, the cross-sectional geometry of the applicator can, for example, be square, rectangular, circular, semi-circular, triangular, or eliptical. As used herein, the term "cross-sectional" is made with reference to a side view perspective as illustrated in FIG. 2. The applicator can be hollow, e.g., a cylinder, or can comprise continuous porous material, e.g., a flat plate. Typical materials of construction of the applicator include, but are not limited to, metal, plastic or ceramic and are often in a sintered state. It is preferred that the applicators have a uniform, interconnected open-cell structure. The applicators of the present invention are stationary with respect to full rotation. As used herein, the term "stationary" means that the applicator does not rotate 360° about an axis. It is, however, within the scope of the invention that the applicator can pivot about an axis, e.g., less than about 180°. Such pivoting can be useful, for example, when coating curved planar surfaces.

Pump 35 is operated, and solenoid valves 33 are open, until the outer surface 41 of applicator 40 is wet. Then pump 35 is turned off and solenoid valves 33 are closed.

In order to establish contact of the coating material with the object, surface 41 of applicator 40 is allowed to contact the surface of object 42 to establish a leading meniscus 43 and a trailing meniscus 44. Then applicator 40 is separated from the surface of object 42. Preferably the distance between the outer surface 41 of applicator 40 and surface of object 42 is from about 0.015 to 0.250 inches, more preferably from about 0.015 to 0.125 inches, and most preferably from about 0.020 to 0.040 inches.

Alternatively, pump 35 can be operated, and solenoid valves 33 can remain open, to establish a downward laminar flow over surface 41 as described with reference to FIG. 1. The coating material can then be permitted to contact the surface of object 42 in order to establish menisci 43 and 44. In this alternative mode of operation, it is not necessary to have physical contact between applicator 40 and object 42 in order to establish the menisci. Once the menisci are established, the downward laminar flow of the coating material is discontinued.

After establishing liquid contact between the surface of object 42 and applicator 40, the surface of object 42 is advanced in a generally horizontal direction across the surface of applicator 40 in the direction of the arrow. It is to be understood that the motion of the object is relative to the applicator. Thus, either object 42 or applicator 40, or both, can physically move relative to each other. It is generally preferred that the orientation of the object to be coated be inverted relative to the applicator. That is, the coating material flows from the applicator to the surface of the object in a generally upward direction. If desired, the orientation of the object can be inverted and inclined. However, regardless of the orientation, the distance between outer surface 41 of applicator 40 and the surface of object 42 is preferably maintained within about ±10 percent throughout the length of the advancement of the object. The speed at which object 42 is advanced over the porous applicator is typically from about 0.5 to 20 inches per minute and preferably from about 2 to 15 inches per minute.

Preferably, during the coating step of the present invention, the downward laminar flow of coating material on surface 41 of applicator 40 is less than about 10 percent and more preferably less than about 2 percent of the total amount of coating material which flows through applicator 40. Most preferably, there is a substantial absence of a downward laminar flow of coating material over the outer surface of applicator 40. Additionally, it is preferred that at least 90 percent and more preferably at least 95 percent of the coating material that flows through applicator 40 is applied as coating 45 to the surface of object 42, i.e., does not flow downward on surface 41 of applicator 40 into container 31. In addition, it is preferred that the flow of coating material through porous applicator 40 is enhanced by capillarity, i.e., capillary action.

The methods of the present invention can be provide extremely thin coatings, e.g., typically less than about 1 micron. Often, the coatings applied by the methods of the present invention are less than about 0.5 microns in thickness, preferably from about 100 angstroms to 0.5 micron in thickness, more preferably less than about 0.2 microns in thickness and most preferably from about 100 angstroms to 0.1 micron in thickness. In addition, the methods of the present invention can provide substantially uniform coating thicknesses over the entire coated surface. Preferably, the tolerance with the respect to the thickness of the coating is about ±5 percent and more preferably about ±2 percent. Coating thicknesses can be measured by any convenient means such as, for example, an interferometer. The above described technique for measuring the coating thickness, as well as others, are known to those skilled in the art.

Quite, surprisingly it is has been found that the methods of the present invention can provide conformal coatings both on objects which have smooth surfaces and on objects which have irregular surfaces such as, for example, silicon wafers and germanium wafers which have stepped topographies. As used herein, the term "conformal" means a coating which has substantially the same thickness at any location on the topography of the surface. That is, the coating thickness in a low spot or crevice is substantially the same as the coating thickness on an elevated portion of the surface or on a side wall of a protrusion on the surface.

The operating temperature and pressure are not critical to the present invention. Typically, the operating pressure at the surface of the object will be at about atmospheric pressure e.g., a psig±about 2 psig. Typically, the temperature ranges from about 60° to about 150° F., although higher or lower temperatures can be employed. In fact, temperatures as high as 200° F. are commonly used for drying the coated surfaces. Preferably, the temperature difference between the surface of the object to be coated and the coating material is less than about 10° F. and more preferably less than about 5° F.

In order to achieve a coating having minimal defects, it is desirable to perform the coating methods of the present invention in a clean room environment. In addition, it is preferred that the surface of the object be cleaned prior to coating, and more preferably immediately prior to coating. Typical cleaning methods include, for example, cleaning with solvents, plasma or ultrasonic vibrations. Cleaning with megasonic vibrations, i.e., about 800 kilohertz to 1.8 megahertz is especially preferred. Megasonic cleaners are commercially available, for example, from Branson Ultrasonics Corporation, Danbury, Conn.

In addition to the cleaning steps, drying steps, e.g., heating and/or purging with an inert gas such as nitrogen, can be performed either prior to or subsequent to the coating step.

FIGS. 3 to 6 illustrate an apparatus suitable for practicing the method of the present invention.

Figure 3:
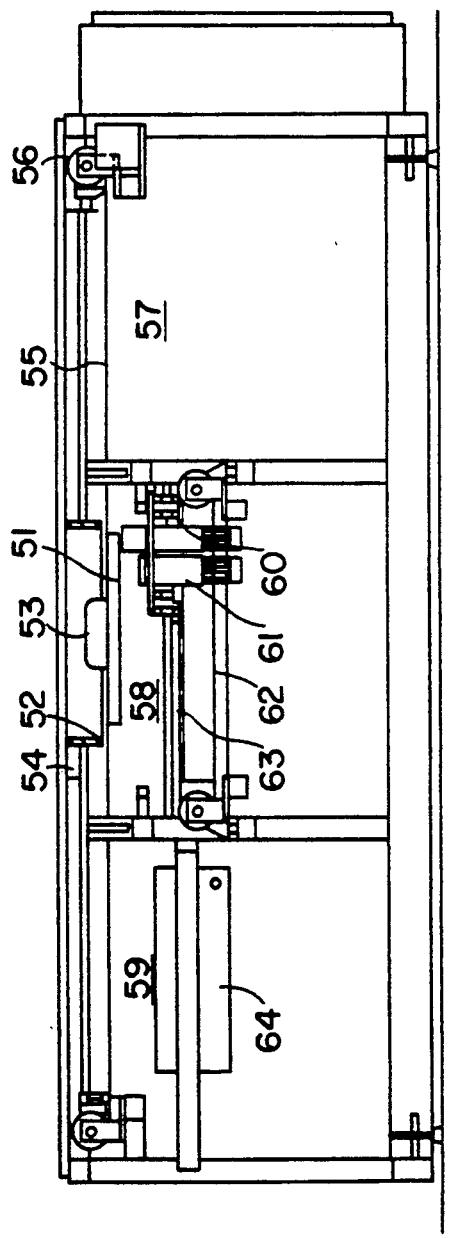
FIG. 3 illustrates a front view of an apparatus suitable for use in practicing a method of in accordance with the present invention.

With reference to FIG. 3, a vacuum chuck assembly 51 is mounted inside a vacuum chuck frame 52 via two rotating bearings 53. One of the bearings is provided with a hollow shaft and a rotating seal to allow a vacuum to be pulled at vacuum chuck assembly 51 for holding the object to be coated. Two spring loaded pins 54 are used to hold the rotating vacuum chuck either in an upright position for loading the object onto vacuum chuck 51 or in the inverted position for the coating cycle. A double chain arrangement and sprockets 56 and a variable speed drive motor (not shown) are used to index vacuum chuck 51 from a load/unload area 57 to a coating area 58 and subsequently to a heating station 59. A coating module 60 and a cleaning module 61 are mounted to a carriage which is moved by a DC motor drive (not shown) and a cable arrangement 62. The horizontal movement is guided by precision roller bearings and guide shafts 63 (one shown). The drying station 59 is provided with an infrared emitter 64 which is vertically adjustable and is used for heating the applied coating so as to enhance vaporization of solvents from the coating material. This type of drying is beneficial since it can inhibit variations in coating thicknesses which often occur when the drying step requires intermediate handling or from forced air drying of wet coatings. Details concerning infrared emitters are known to those skilled in the art.

Figure 4:
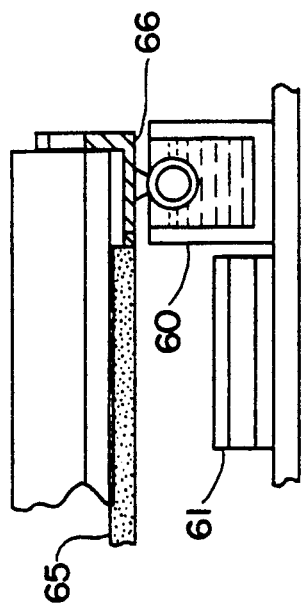
FIG. 4 illustrates a detailed view of a portion of the apparatus shown in FIG. 3 wherein coating occurs.

FIG. 4, shows a detailed view of a section of coating area 58. Coating module 60 is illustrated in a position ready for coating. Cleaning module 61 is shown in a standby position. An object 65 to be coated is butted against a knife edge 66. Knife edge 66 is vertically adjustable to compensate for varying thicknesses of object 65 and forms an extension of the surface at precisely the same elevation as the surface of object 65. The purpose of knife edge 66 is to provide a surface to establish the menisci and, hence, initiate the flow of coating material from coating module 60 to the surface of object 65. Once the menisci are established, object 65 can be advanced across and above the surface of a porous applicator in coating module 60. Thus, for purposes of the present invention, the phrase "surface of the object" also includes the surface of the knife edge. Another knife edge (not shown) is provided on the opposite end of object 65 to provide a clean break of coating material when coating is completed.

Figure 5:
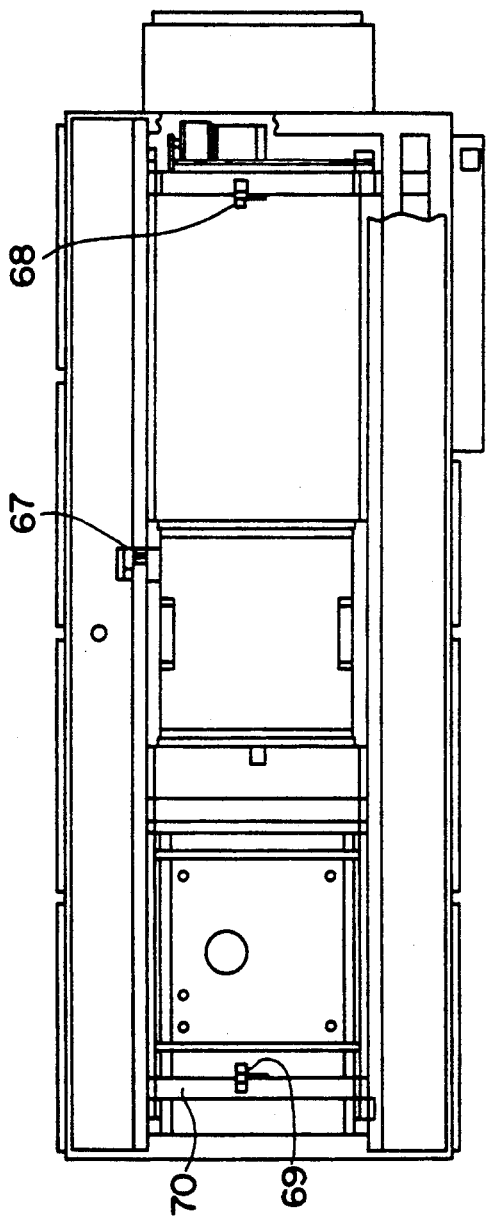
FIG. 5 illustrates a top view of the apparatus shown in FIG. 3.

With reference to FIG. 5, microswitches 67, 68 and 69 are mounted to a frame 70 of the apparatus to act as positive stop controls in order to position vacuum chuck 51 at the desired locations.

Figure 6:
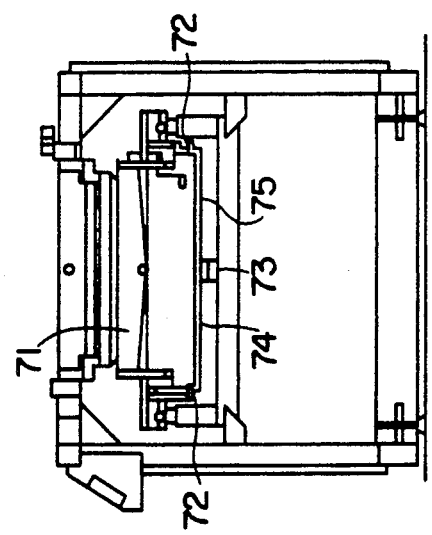
FIG. 6 illustrates a side view of the apparatus shown in FIG. 3.

With reference to FIG. 6, a housing 71 containing coating module 60 is vertically adjustable by two lead screws 72 and a stepper motor 73 via 2 timing belts 74 and 75.

The following examples are provided for illustrative purposes and are not intended to limit the scope of the claims which follow. An apparatus similar to that described with reference to FIGS. 3 to 6 was used for the examples.

EXAMPLE 1

Example 1 illustrates a coating method such as described with reference to U.S. Pat. No. 4,370,356. The objective of Example 1 was to coat a 12 inch by 14 inch glass panel with a film of blue colored polyimide to act as a color film filter. A polyimide coating material in a N-methylpyrrolidone solvent having a viscosity of 83.4 centipoise at 72° F. was obtained from Brewer Science, Inc., Boise, Id., sold under the trade name BLUE POLYIMIDE 09. The coating material was diluted to contain 40 percent by volume methyl ethyl ketone. A sintered stainless steel tube having a pore size of about 10 microns and a wall thickness of about 0.125 inch was used as the porous applicator.

While maintaining a downward laminar flow of coating material over the outside surface of the porous applicator, the coating material was applied to the glass panel. The glass panel was advanced over the porous applicator at a rate of about 15.5 inches per minute to apply the coating. The coating thickness, as measured by a Sloan Dektak Profilameter, a mechanical stylus type measuring device available from Sloan Technology Corp., Santa Barbara, Calif., was about 2.4 microns and the uniformity, i.e., tolerance, was about ±2 percent over the entire surface area of the glass panel.

EXAMPLE 2

Example 2 illustrates a coating method in accordance with the present invention. The objective of Example 2 was to apply a photoresist to a 4 inch diameter germanium wafer at a coating thickness of about 1500 angstroms. The coating material was a positive-acting photoresist and was obtained from Shipley Corp., Newton, Mass., sold under the trade name AZ 1350 B. The coating material had a solids content of about 14 weight percent. A sintered stainless steel tube having a pore size of about 10 microns and a wall thickness of about 0.125 inch was used as the porous applicator.

First, the method described in Example 1 was used to coat the panel. However, coating thicknesses as thin as about 1500 angstroms could not be achieved.

Next, the following procedure was used. A downward laminar flow of coating material was established on the outer surface of the porous applicator. While continuing the downward laminar flow, contacting of the coating material was established between the surface of a knife edge and the porous applicator. The downward laminar flow of coating material was then discontinued by turning the pump off and closing the solenoid valves. In this experiment, a long knife edge, i.e., about 4 inches, was used to allow excess coating material to be depleted prior to initiating coating of the surface of the wafer. The wafer was then advanced over the applicator at a rate of about 3 inches per minute to apply the coating. The thickness of the coating on the panel was of about 1,300 to 1,400 angstroms as measured by interference measurement, and the tolerance was about ±7 percent.

EXAMPLE 3

Example 3 illustrates a coating method in accordance with the present invention. The objective of Example 3 was to apply a coating of a polyimide to a stainless steel surface having a fine sand blasted finish at a coating thickness of about 400 angstroms. The coating material was a polyimide in a N-methylpyrrolidone solvent having a solids content of about 21 weight percent and was obtained from DuPont Chemical, Wilmington, Del., sold under the trade name PI 2555. The coating material was diluted to a solids content of about 1 percent by volume polyimide with a mixture of 60 percent N-methylpyrrolidone and 40 percent methyl ethyl ketone prior to the coating step. The surface of the object was cleaned by a hot detergent immersion with ultrasonic treatment followed by water rinsing with dionized water, nitrogen purging and oven drying at about 250° F. The surface was then treated by a 10 minutes plasma ashing using a mixture of oxygen and argon. A sintered stainless steel tube having a pore size of about 10 and a wall thickness of about 0.125 inch was used as the porous applicator.

The surface of the porous applicator was wetted by pumping the coating material through the wall of the porous applicator. The pumping was then discontinued. After discontinuing the pumping, the surface of the porous applicator was contacted with a knife edge adjacent to the steel surface to establish the menisci. The applicator was then separated from the knife edge to a distance of about 0.060 inch. While maintaining the menisci between the knife edge and the porous applicator, the stainless steel panel was advanced across the applicator at a rate of about 3 inches per minute to apply the coating. The coating thickness was estimated to be approximately 400 angströms and the tolerance was about ±5 percent.

Although, the invention has been described with respect to specific aspects, those skilled in the art will recognize that other aspects are intended to be included within the scope of the claims which follow.

I claim:

1. In a method for coating a surface of an object with a coating material comprising the steps of:
   a) flowing the coating material through a wall of a stationary, permeable applicator, so as to develop a downward laminar flow of the coating material on an outer surface of the applicator;
   b) contacting the coating material on the outer surface of the applicator with the surface of the object to be coated to establish menisci of the coating material between the surface of the object and the outer surface of the applicator;
   c) advancing the surface of the object in a generally horizontal direction across the outer surface of the applicator; and
   d) maintaining the flow of the coating material through the wall of the applicator to provide a coating of the coating material on the surface of the object;
   the improvement which comprises discontinuing the downward laminar flow of the coating material on the outer surface of the applicator prior to advancing the surface of the object across the outer surface of the applicator.

2. The method of claim 1 wherein the downward laminar flow is discontinued prior to contacting the coating material with the surface of the object.

3. The method of claim 2 wherein the outer surface of the applicator is contacted with the surface of the object to establish the menisci.

4. The method of claim 3 wherein the outer surface of the applicator is separated from the surface of the object prior to advancing the surface of the object.

5. The method of claim 1 wherein the downward laminar flow is discontinued subsequently to contacting the coating material with the surface of the object.

6. The method of claim 1 wherein the coating material flows through the wall of the applicator by capillarity.

7. The method of claim 1 wherein the surface of the object and the applicator are separated by a distance from about 0.015 to 0.250 inches.

8. The method of claim 7 wherein the distance between the surface of the object and the applicator is from about 0.015 to 0.125 inches.

9. The method of claim 1 wherein the coating has a thickness of less than about 0.5 microns.

10. The method of claim 9 wherein the coating has a thickness of from about 100 angströms to 0.5 microns.

11. The method of claim 10 wherein the coating has a variation in thickness of less than about ±5 percent over the surface of the object.

12. The method of claim 1 wherein the surface of the object is inverted relative to the applicator.

13. The method of claim 12 wherein the surface of the object is planar.

14. The method of claim 13 wherein the surface of the object has a stepped topography.

15. The method of claim 14 wherein the coating is substantially conformal.

16. The method of claim 14 wherein the outer surface of the applicator is flat.

17. The method of claim 14 wherein the outer surface of the applicator is curved.

* * * * *